United States Patent [19]

Ma

[11] 3,962,643
[45] June 8, 1976

[54] ABRUPT JUNCTION VARACTOR DIODE TELEVISION TUNER

[75] Inventor: John Y. Ma, Glenview, Ill.

[73] Assignee: Zenith Radio Corporation, Chicago, Ill.

[22] Filed: Aug. 5, 1974

[21] Appl. No.: 494,449

[52] U.S. Cl. .............................. 325/464; 325/459; 325/462
[51] Int. Cl.² ......................................... H04B 1/06
[58] Field of Search ........... 325/383, 430, 431, 439, 325/442, 452, 453, 458, 459, 462, 463, 464, 465, 490; 334/14, 15, 47, 52, 56, 60; 307/320; 357/14; 338/201, 202

[56] References Cited
UNITED STATES PATENTS

| | | |
|---|---|---|
| 3,204,207 | 8/1965 | Denker .................................. 334/15 |
| 3,626,352 | 12/1971 | McCoig ............................... 338/201 |
| 3,628,152 | 12/1971 | Carlson ................................ 325/464 |
| 3,646,450 | 2/1972 | Ma ......................................... 325/465 |
| 3,662,271 | 5/1972 | Nakanishi ........................... 325/459 |
| 3,685,141 | 8/1972 | Sandera ............................... 357/14 |
| 3,715,671 | 2/1973 | Worchester .......................... 334/15 |
| 3,767,112 | 10/1973 | Tonari ................................. 325/459 |
| 3,794,924 | 2/1974 | Furuya et al. ........................ 325/464 |
| 3,878,466 | 4/1975 | Henrickson ........................ 325/464 |

Primary Examiner—George H. Libman
Assistant Examiner—Jin F. Ng
Attorney, Agent, or Firm—Nicholas A. Camasto

[57] ABSTRACT

A VHF television tuner has four tunable circuits each including an abrupt junction varacto diode having a predictable capacitance tuning voltage characteristic. The VHF frequency spectrum is divided into Lo and Hi bands encompassing television channels 2-14 6 and 7-14 13, respectively. A pair of voltage divider networks comprising precisely trimmed resistive material on a ceramic substrate provide tuning voltage terminals corresponding to the VHF television channels. The end terminals of each divider network are coupled to adjustable potentiometers for setting the tuning voltage at each extreme of the voltage divider. A substrate mounted switch accesses the tuning voltage poins, supplies bandswitching voltages and provides AFC defeat between channels.

21 Claims, 14 Drawing Figures

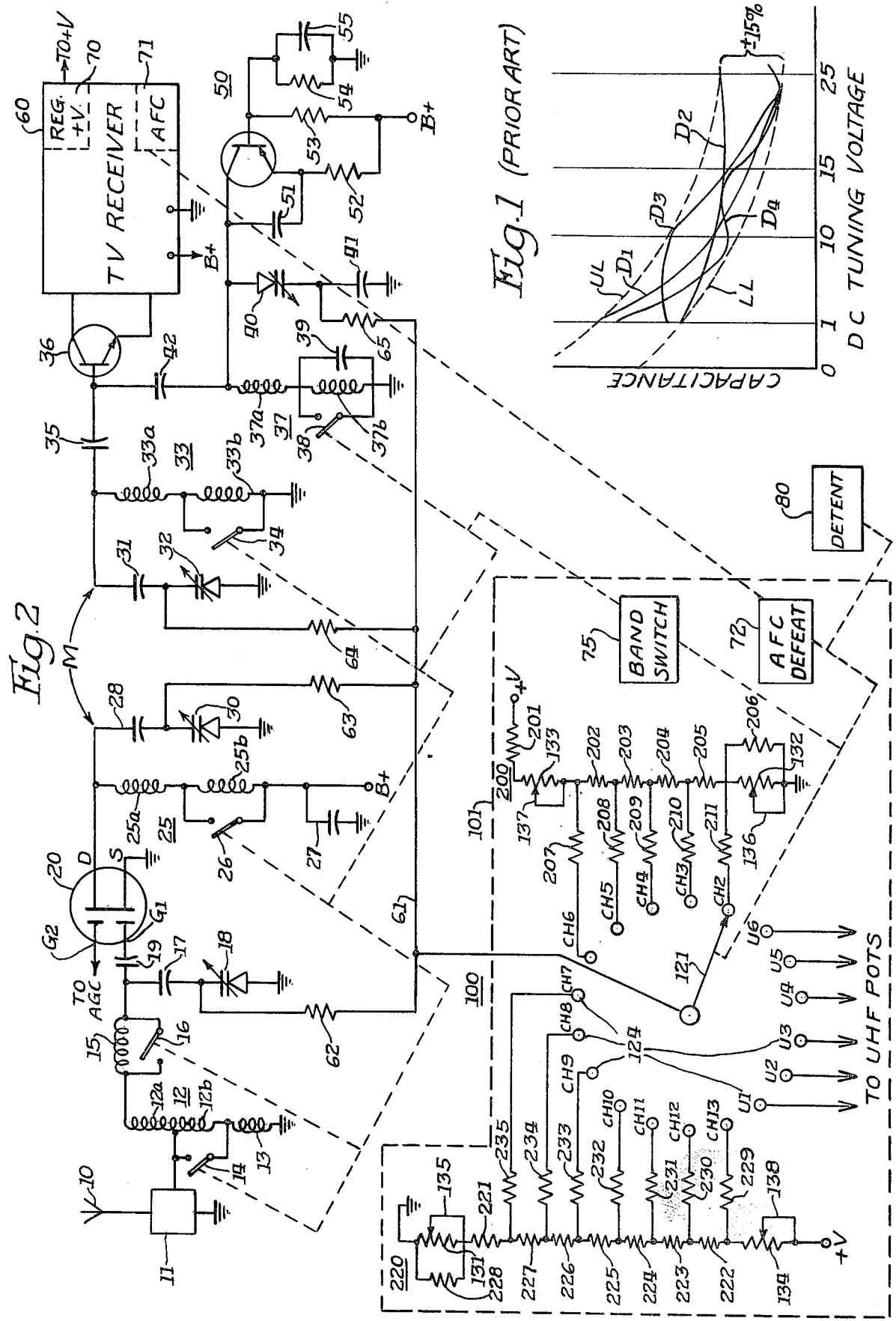

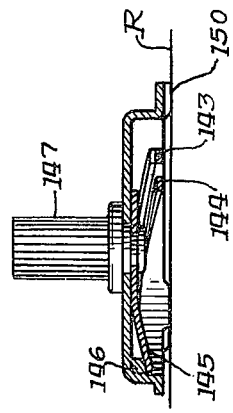
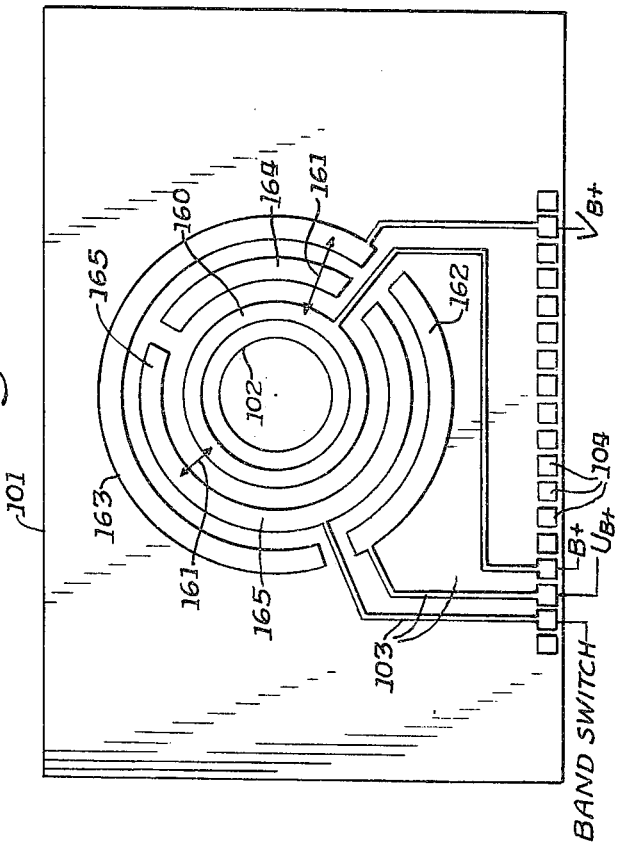
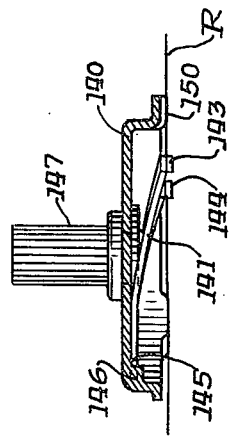
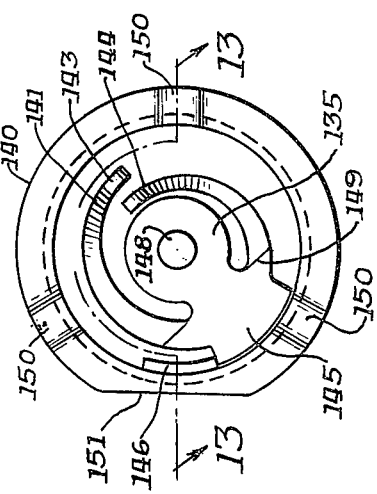
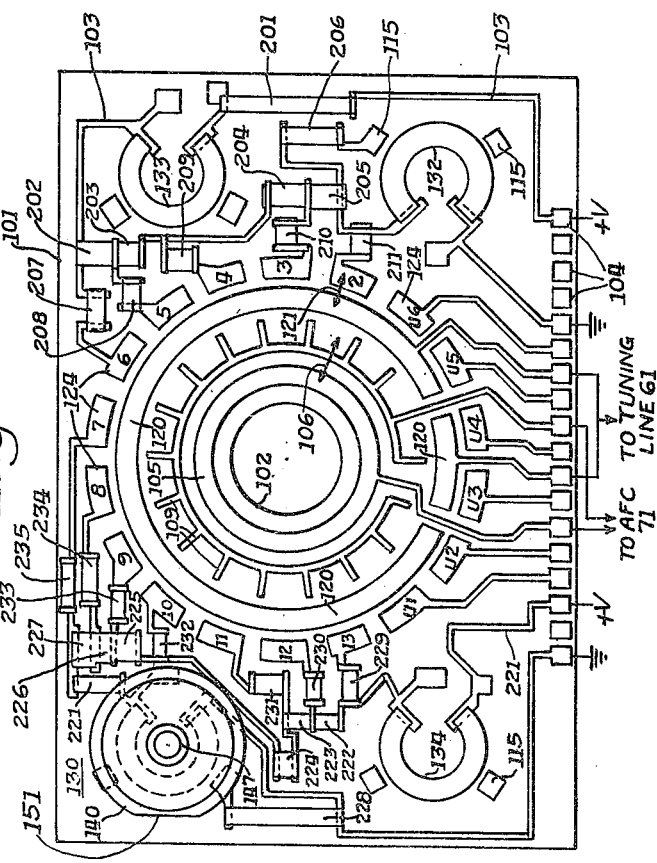

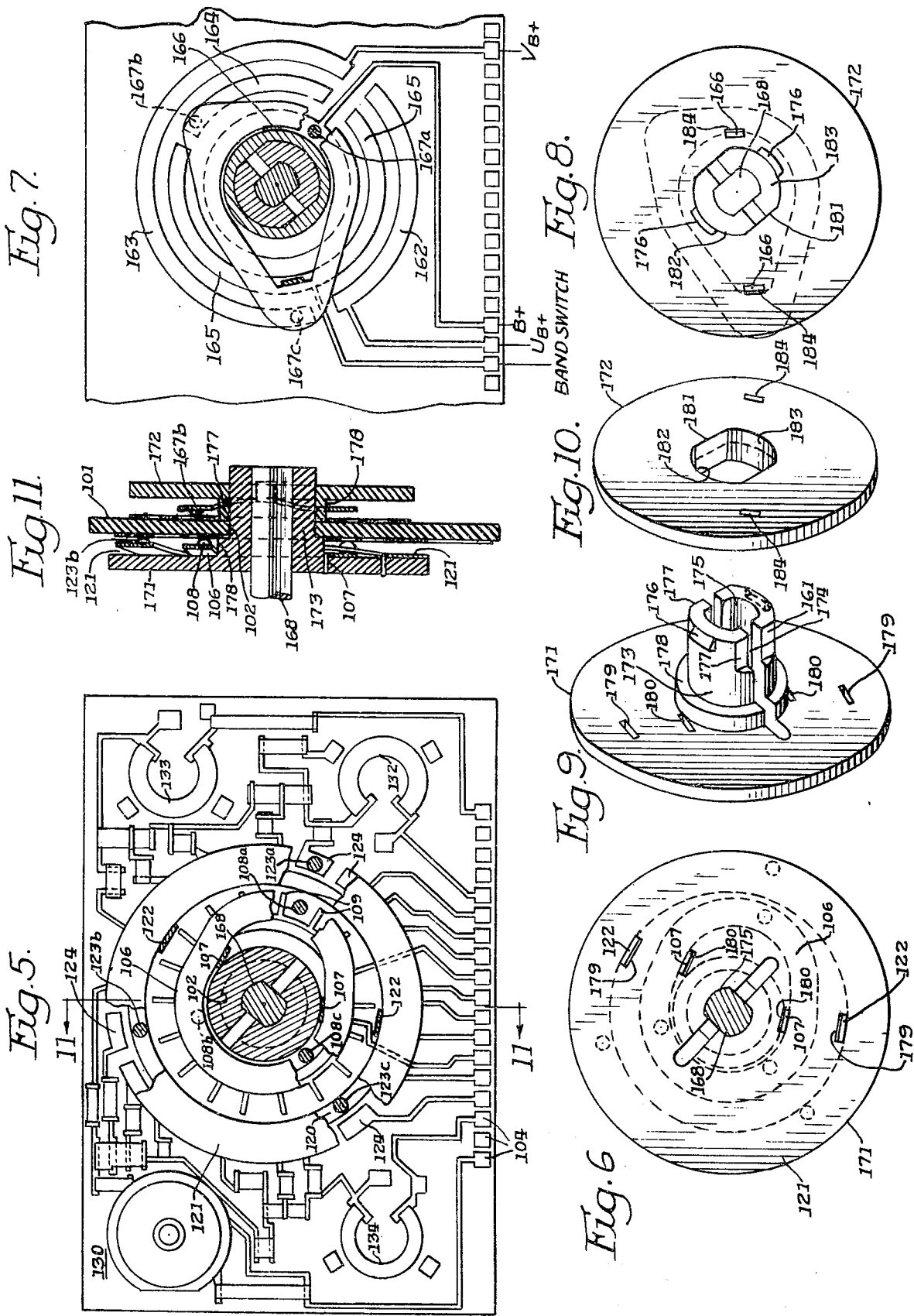

ABRUPT JUNCTION VARACTOR DIODE TELEVISION TUNER

RELATED PATENT APPLICATIONS

This application discloses apparatus claimed in related copending applications Ser. No. 502,482, filed Sept. 3, 1974, entitled "TELEVISION TUNING SYSTEM WITH PRECISION SUBSTRATE SWITCH ASSEMBLY" in the name of John Y. Ma and Ser. No. 494,113, filed Aug. 2, 1974, entitled "POTENTIOMETER WIPER ASSEMBLY" in the name of Robert H. Rhodes, both assigned to Zenith Radio Corporation.

BACKGROUND OF THE INVENTION

This invention relates to television receiver tuners. Television tuners, especially electromechanical tuners, are inherently complex and have long been a source of difficulty and expense in television receivers. Due in part to the unfortunate, separated and non-uniform frequency band allocations, television tuners have generally needed a mechanism to physically switch tuning elements in the appropriate tunable circuits in the tuner amplifier, oscillator and mixer stages. Such tuners have taken many specific forms and, in general, have provided excellent service. They are, however, cumbersome, prone to erratic operation and subject to malfunctioning from normal wear and tear and dirt accumulation. Additionally, their use imposes esthetic design limitations, adds complexities in remote control applications and generates undesirable mechanical noise. They also are physically large. A relatively recent development has been an electronic silent-tuning system for television receivers. The varactor diode is the device which has made this system practical.

A varactor diode exhibits capacitance changes with changes in applied DC potential across its terminals. The capacitance of the diode is a function of the junction area, the applied potential and the type of doping. Varactor diode tuners have been known and in use for a number of years and indications are that they will render electromechanical type tuners obsolete.

A varactor tuner uses varactor diodes to provide variable capacitance for adjusting the resonant frequencies of its tunable circuits, by application of appropriate magnitude DC tuning voltages. The wide frequency spectrum encompassing the VHF and UHF television signal bands have dictated use of so-called hyper abrupt junction varactor diodes which exhibit large capacitance changes for a given tuning voltage change. (This characteristic is described as the Cmax/Cmin ratio or the C-V characteristic of the diode.) Such diodes are, in turn, expensive to make and variable in characteristics. As will be seen, hyper abrupt diodes for present day varactor tuners are carefully selected to insure matched performance among the various tuner stages.

The VHF television spectrum or range embraces three distinct bands of frequencies. The first band is from 57 MHz to 69 MHz (channels 2–4), the second band is from 79 MHz to 85 MHz (channels 5 and 6) and the third band is from 177 MHz to 213 MHz (channels 7–13). Each television channel occupies 6 MHz and the above limits are measured from the center frequencies of the channels. The overall frequency ratio, that is, the ratio of the maximum to minimum channel frequency in the VHF range is about 3.7:1

$$\left(\frac{213 \text{ MHz}}{57 \text{ MHz}}\right).$$

The UHF range is a single continuous band extending from 473 MHz to 887 MHz and has a frequency ratio of 1.9:1.

In general, for capacitance tuning of the tuned circuits, the capacity ratio Cmax/Cmin (ratio of maximum to minimum value of tuning capacity) required is related to the square of the frequency ratio. A frequency ratio of 3:1 would dictate a capacitance ratio of $3^2$:1 or 9:1, without provision for any safety margin. Even with hyper abrupt junction diodes, the 3.7:1 frequency ratio in the VHF spectrum is unattainable without bandswitching.

Bandswitching involves changing the values of one of the reactive components in the tuned circuit to enable the same value opposite sign reactance component to tune the circuit to a different resonance point. In practice the VHF spectrum is divided into two frequency sections, the "Lo" band comprising the above-mentioned first and second bands (channels 2–6) and the "Hi" band comprising the third band (channels 7–13). The Lo band channel frequency ratio (57–85 MHz) is approximately 1.5 and the Hi band channel frequency ratio (177–213 MHz) is about 1.2. The capacity ratios are, therefore, about 2.25 and 1.4, respectively. The bandswitch generally shorts out a portion of the inductance in each tuned circuit for tuning the circuits to higher resonant frequencies with the same varactor diode capacitance.

Other important factors are that the minimum tuning voltage used must be large enough to preserve the signal handling capability of the tuner and the gain and bandwidth of the tuner must be maintained. This factor, referred to as the gain-bandwidth product, is of great importance and will be seen to be directly related to the tuning capacitance and the stray capacitance present in the tuner signal translation system.

While varactor diodes exhibit capacity changes for DC voltage changes of very small magnitude, tuning voltages below 1 volt DC are considered unusable in television tuners, because the signal levels in the tuner are often large enough to produce noticeable changes in such low tuning voltage with consequent signal distortions. At the other extreme, the internal resistance of the varactor diode increases for higher rated breakdown voltages. Thus, while greater C-V range may be attained by using diodes of higher voltage breakdown and increasing the tuning voltage, the diode internal resistance limits the gain achievable in the tuner at the high frequency channels, and is, therefore, self-defeating. This factor effectively imposes an upper limit on the tuning voltage of about 25 volts. Therefore, the usable tuning voltage range for the varactor diode is between 1 and 25 volts.

The gain-bandwidth factor of the tuner is important since it is desired to amplify signals in all portions of the television spectrum uniformly. Amplifying devices exhibit decreasing gain with increasing frequency and the high frequency gain of the tuner must, therefore, be maximized because it effectively establishes the overall tuner gain. This portion of the tuning range corresponds to minimum tuning capacitance of the varactor diode and maximum tuning voltage, since the diode operates in the depletion mode. To maintain high frequency gain, the smallest minimum value of tuning capacitance is used. On the other hand, other factors place restrictions on the value of the minimum capacitance, primarily the stray capacitance of the tuner.

During production of a tuner, alignment is performed by applying an appropriate signal (as well as numerous marker frequencies) to the tuner and observing its response characteristic on an oscilloscope. For VHF, the oscillator coil is adjusted at the high end of both the Hi and Lo bands, that is, at channels 13 and 6. Adjustment takes the form of physically distorting turns of the coil with a thin flat object and is referred to as "knifing". The physical distortion, of course, affects the inductance of the coil. Then the middle of the Hi band (channel 10) is adjusted by knifing the coils in the interstage and RF stages, followed by a similar adjustment in the middle of the Lo band (channel 4). The process may be repeated a number of times because of the tendency of the coils to "relax" after knifing and change their values.

All physical distortion or movement of the tuner components has an effect on the miscellaneous capacitance of the tuner. Other significant sources of capacitance are the tuner wiring, and the bandswitching diodes generally incorporated in tuners, although not illustrated in this invention. By far, the largest factor in tuner capacitance is contributed by the input capacitance of the signal translation means in the tuner, mainly the RF amplifier. The input capacitance of a FET amplifier is relatively fixed from device to device and is on the order of 5 pf. Preliminary investigations indicate so-called D MOS FET's may have an input capacitance of less than 5 pf. In any case, these capacities are lumped into one quantity and referred to as the stray capacitance Cs of the tuner. The tuner stray capacity thus consists of the input capacitance of the signal translation means plus the miscellaneous capacitances mentioned above and may vary somewhat from tuner to tuner.

All of these factors have dictated the use of large Cmax/Cmin varactor diodes, with at least one bandswitching in the VHF spectrum. Consequently, only varactor diodes of the hyper abrupt junction type have been used in television tuners.

As will be explained fully when analyzing the behavior patterns of the various types of varactor diodes, the gamma factor ($\gamma$) for a hyper abrupt junction diode is not a constant and results in the diode C-V characteristic being unpredictable. This poses a very practical problem in tuner design where one varactor diode is used in the RF stage, another in the oscillator stage, and two others in the tuned interstage coupling network. The four diodes must "track" with tuning voltage. That is, not only the Cmax/Cmin ratio of each diode must be substantially the same, but the actual capacity exhibited at a given tuning voltage must be within very close tolerances.

The difficulties of manufacturing hyper abrupt junction varactor diodes are numerous, but among the most important are that the capacitances exhibited by the diodes at any particular tuning voltage differ, the Cmax/Cmin ratios differ and, worst of all, because the gamma factor is not a constant, neither characteristic may be reliably predicted at any other tuning voltage based on its value at any given tuning voltage. Thus stringent specifications and limits are required for television tuner varactor diodes.

In order to maintain an acceptable manufacturing yield of these diodes, elaborate diode characteristic comparison steps or "sorts" are performed to group sets of four matched diodes for a tuner. A generally accepted current industry standard specifies that the diodes in a tuner must have a capacitance value well within 1.5% of each other at four selected tuning voltages (1, 10, 15 and 25 volts DC).

The diodes are typically initially sorted into ten groups of ± 1.5% limit within a range of ± 15% of the bogey or nominal capacitance value at tuning voltages of 1 volt and 25 volts. The sorted diodes are further sorted into similar ± 1.5% categories at intermediate tuning voltages of 10 and 15 volts. The result is $10^4$ (10,000) categories to achieve groups of four diodes matched within ± 1.5% of each other and within ± 15% of the nominal value at the four selected tuning voltages.

The diodes are supplied to the tuner manufacturer in matched sets and are effectively "married" to a particular tuner. Should one of the diodes in a tuner fail or need to be replaced for any reason, all four diodes must be replaced. This not only adds to the cost of tuner manufacture but also imposes limitations on servicing, parts inventories, alignment procedures, etc.

The tuner of the invention covers the VHF frequency spectrum in two bands, uses substantially equal ranges of tuning voltages, and incorporates abrupt junction varactor diodes exhibiting highly predictable C-V characteristics. The value of minimum tuning capacitance is selected to maintain an acceptable gain over the operating bandwidth of the tuner and the tuning voltage range is optimized within the limits established by the signal handling capability of the tuner and diode breakdown voltage.

The benefits that flow from the invention are many and varied. The costly and time consuming diode sorting operations required with hyper abrupt junction diodes is eliminated. With abrupt junction diodes, these matched diodes are replaced by any randomly selected diodes of the same initial capacity.

With predictable tuning curves for the tuner (because of the predictable C-V characteristic of the diodes), the ratios between various channel tuning voltages become precise. A voltage divider network of precise resistance ratio is thus usable to establish these tuning voltages corresponding to the desired channels in the VHF television spectrum.

As will be described in conjunction with the preferred embodiment of this invention, but claimed in copending application Ser. No. 502,482, the divider networks may conveniently be printed on an alumina substrate which forms a part of a switch assembly. The resistors may be trimmed to precision ratios automatically with well-known automated laser trimming apparatus and techniques.

As will be further described, a pair of settable potentiometers are also incorporated on the substrate for establishing the end terminals of the voltage divider network at the correct tuning voltages corresponding to the limit channels in the band. These potentiometers form the subject matter of another copending application Ser. No. 494,113.

Setup of the receiver tuner in the factory is materially simplified by merely adjusting the tuning voltages at the end points of a voltage divider network to correspond to the limit television signals in the band. Correct tuning voltages for intermediate television signals are automatically obtained because of the precise ratio between resistors in the voltage divider network and the predictable C-V diode characteristic.

As will be apparent to those skilled in the art, it is also unnecessary to provide any means for "fine tuning" the television tuner. The term fine tuning is actually a misnomer as evidenced by the fact that manual fine tuning controls exist in television receivers equipped with "automatic fine tuning" systems. Fine tuning more correctly applies to the means provided to "set" the tuner oscillator to receive a particular frequency signal at the appropriate location. These means are provided because it has heretofore not been possible to make tuners of sufficient consistency to preclude their need. In accordance with another aspect of the invention, no fine tuning is needed provided the resistor network is temperature and age stabilized and coupled to a source of stable DC voltage. These criteria are clearly meetable by state of the art technology and the former attainable in a functionally and economically attractive manner by the alumina substrate switch assembly of the above-mentioned copending application Ser. No. 502,482.

SUMMARY OF THE INVENTION

In accordance with the invention, a tuner for tuning television signals in a wide frequency range comprises, signal translation means producing an intermediate frequency signal, translation means having a predetermined input capacitance and including a plurality of tunable circuits each having an abrupt junction type varactor diode for tuning, and means imposing tuning voltages on the diodes for simultaneously varying their capacitance and changing the tuning of the tunable circuits in a tracking manner. The varactor diodes are selected to have a capacitance at the maximum tuner frequency that is greater than the input capacitance of the translation means to cover the tuning range and small enough to preserve the gain-bandwidth product.

OBJECTS OF THE INVENTION

Accordingly, the primary object of this invention is to provide a novel varactor diode television tuner.

Another object of this invention is to provide an improved economical varactor diode tuner which does not require fine tuning.

A further object of this invention is to provide a novel varactor tuner which is more easily manufactured.

Still another object of this invention is to provide a novel varactor tuner which is simple to set up.

BRIEF DESCRIPTION OF THE DRAWINGS

These and other objects of the invention will become apparent upon reading the following description in conjunction with the accompanying drawings in which:

FIG. 1 shows some representative capacitance tuning voltage curves of hyper abrupt junction diodes and the tuner specification limits of the prior art;

FIG. 2 is a schematic diagram of a television tuner incorporating the principles of the invention;

FIG. 3 is a plan view of the substrate which is part of the switch assembly of FIG. 2;

FIG. 4 is a view of the obverse side of the substrate of FIG. 3;

FIG. 5 is a plan view of the substrate of FIG. 3 showing the AFC and channel switch wipers;

FIG. 6 is a view of the end plate to which the wipers of FIG. 5 are mounted;

FIG. 7 is a partial view of the substrate of FIG. 4 showing the B+ and bandswitch wiper;

FIG. 8 is a view of the end plate mounting the wiper of FIG. 7;

FIGS. 9 and 10 are perspective views of the end plates and their method of assembly;

FIG. 11 is a sectional view taken along line 11—11 of FIG. 5 showing the assembled switch and substrate;

FIG. 12 is an underside view of the potentiometer housing illustrated on the substrate of FIGS. 3 and 5;

FIG. 13 is a sectional view taken along line 13—13 of FIG. 12 showing the potentiometer wiper in a first position; and FIG. 14 is a sectional view taken along line 13—13 of FIG. 12 showing the potentiometer wiper in a second position.

A brief description of the limits established for tuner diodes of the prior art, varactor diode characteristics and the mathematical basis underpinning the invention will be given.

The C-V curves of FIG. 1 show some of the possible variation of hyper abrupt junction diodes used in prior art tuners and the limits discussed above. The dashed line curves UL and LL, respectively, are the upper and lower limits of capacitance for various tuning voltages and represent an approximate ± 15% variation from a mid position or bogey curve. Diodes varying outside these limits are not suitable for use in a production type, as distinct from a handmade, tuner. The curves D1–D4 show the extremes of variation in capacitance exhibited by hyper abrupt junction diodes which are within the acceptable limits UL and LL. It must be borne in mind that these large variations in C-V characteristic are due to the junction regions being just a few microns deep. With such small dimensions, even minor variations in doping levels during junction formation create very unpredictable C-V curves.

No pair of diodes represented by the curves D1-D4 would satisfy the other criterion that at selected tuning voltages the diode capacitances must be within 1.5% of each other for tracking. The enormous sorting task required to group the diodes to satisfy these criteria of matching is obvious. While the tuning voltages indicated are 1, 10, 15 and 25 volts, in practice they are selected for the areas of the C-V curve which experience indicates are most critical. Fewer points, of course, may be selected, but at a cost of potential problems in tracking the tuners. Obviously, matching at more points enhances tuner tracking but adds substantial cost.

The following curves for the three type varactor diodes show the variations in dopant level as a function of distance X from the junction. X, it should be remembered, is only a matter of a few microns.

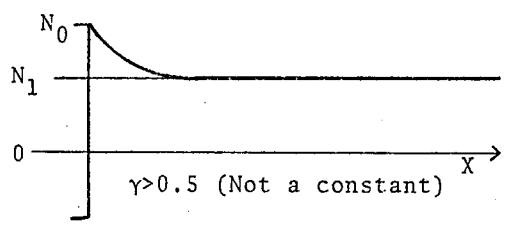

Hyper Abrupt

Junction

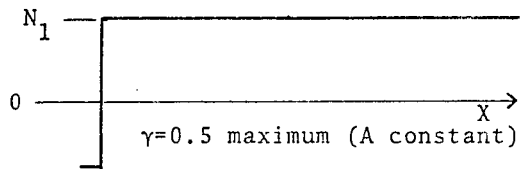

Abrupt Junction

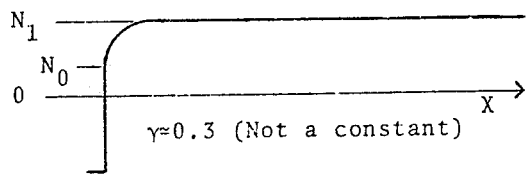

Graded Junction

In the above, $N_0$ is the initial doping level and $N_1$ is the final doping level.

In the abrupt junction diode, N is constant whereas in the hyper abrupt and graded junction diodes, N is not a constant. Typically $N_0$ for a hyper abrupt junction device may be $6 \times 10^{16}$ donors per cubic centimeter and $N_1$ about $0.25 \times 10^{16}$ donors per cm³. For an abrupt junction device N may be on the order of $2 \times 10^{16}$ donors cm⁻³. It will be appreciated that the capacitance of the diode is a function of the area of the junction and that many exotic phenomena are involved in the design and fabrication of such devices, all of which are beyond the scope of this discussion.

An analysis of the many variables that determine varactor diode characteristics as they relate to the equally diverse television tuner requirements was undertaken.

The general formula for the capacitance exhibited by a varactor diode at any voltage $V_2$ as a function of the capacitance exhibited at a voltage $V_1$ is $$\frac{C_1}{C_2} = \left(\frac{V_2+\phi}{V_1+\phi}\right)^\gamma \tag{1}$$

where $\phi$ is the diode contact potential, and $\gamma$ is the diode power law factor. The $\gamma$ of a typical hyper abrupt junction diode may be 0.7, whereas for an abrupt junction device it is theoretically 0.5, but practically only approaches 0.5.

The graded junction varactor diode has a $\gamma$ of about 0.3, which is obviously too low to be of interest for use in television tuners.

Because of the need to maintain the Q of the tuner circuits at a high level, it was believed very important to hold the junction resistance of the diode to a low level. From Gauss' Law:

$$E_M = \frac{1}{\epsilon\epsilon_o} \int_0^{W_M} N_D(x)dx$$

where
- $E_M$ = maximum electric field
- $\epsilon$ = electrical field
- $\epsilon_o$ = electrical field at the metallurgical boundary of a PN junction
- $W_M$ = width of the N layer
- $N_D$ = donor concentration on the N type side of an abrupt NP junction
- $x$ = distance from junction The total resistance per unit area of a device of length $W_M =$ $$R_W = \frac{1}{\mu q} \int_0^{W_M} \frac{dx}{N_D(x)}$$

where
- $\mu$ = the effective mobility and
- $q$ = magnitude of electronic charge The maximum and minimum capacitances of the diode are established by circuit requirements. In order to find the functional dependence of $N_D$ on $x$ to minimize $R_W$ (and maximize the Q of the diode) the isoperimetric problem is solved by finding the stationary condition of $$\int_0^{W_M} \frac{N_D(x)dx}{\epsilon\epsilon_o} + \frac{\lambda}{\mu q N_D(x)} \cdot dx$$

where
$\lambda$ is the Lagrange multiplier.
This amounts to solving the Euler equation $$\frac{d\left[\frac{N_D(x)}{\epsilon\epsilon_o} + \frac{\lambda}{\mu q N_D(x)}\right]}{dN_D(x)} = 0$$

Hence $$N_D = \sqrt{\frac{\lambda\epsilon\epsilon_o}{\mu q}}.$$

which is a constant. Therefore, if the doping level is constant, $R_w$ is minimized and the device Q is optimized.

$N_D$ is a constant for an abrupt junction device and hence the abrupt junction varactor diode has optimum Q.

The most critical frequency range is the VHF Lo band because of the large frequency ratio, $F$ $$F = \frac{85+2}{57-2} \frac{(\text{MHz})}{(\text{MHz})} = 1.58$$

85 MHz is the center frequency of channel 6
57 MHz is the center frequency of channel 2
The 2 MHz are safety factors used to take into consideration variations of stray capacitance, random tolerance grouping, etc. The required C ratio is $(1.58)^2 = 2.5$ The range of capacitance required is, therefore, $$\frac{C_{max}+C_s}{C_{min}+C_s} = 2.5 \tag{2}$$

when $C_s$ = stray capacitance of the tuner.
A typical value of $C_s$ in a tuner is 5 pf. Therefore, $$\frac{C_{max}+5}{C_{min}+5} = 2.5$$

In order to keep the gain-bandwidth product of the tuner as large as possible, it has been discovered that, with a stray capacitance of 5 pf, the minimum value of tuning diodes capacitance is about 7 pf.

With $C_{min} = 7$, equation (2) may be solved.

$$\frac{C_{max}+5}{7+5} = 2.5$$

$$C_{max} + 5 = 2.5 (7+5)$$

$$C_{max} = 30-5 = 25$$

therefore $$\frac{C_{max}}{C_{min}} = 3.57$$

From equation (1)

$$\frac{C_1}{C_2} = \left(\frac{V_2+\phi}{V_1+\phi}\right)^\gamma$$

Using limit tuning voltages of 1 volt and 25 volts and a contact potential of $\phi = 0.6$.

$$\frac{C_1}{C_2} = \left(\frac{25.6}{1.6}\right)^\gamma$$

Substituting 3.57 for $C_1/C_2$, $$3.57 = \left(\frac{25.6}{1.6}\right)^\gamma = (16)$$

$$\gamma \log 16 = \log 3.57$$

$$\gamma = \frac{\log 3.57}{\log 16} \quad 0.46$$

Thus it appears that mathematically, the most difficult tuning range may be covered with abrupt junction diodes.

In an actual experiment 50 Motorola type MB 2105 abrupt junction diodes were obtained and installed in a suitably designed VHF tuner to be described. All diodes covered the frequency range and 49 were within tracking limits. One diode exhibited an unpredictable C-V characteristic at one part of the frequency spectrum. Upon inquiry with the manufacturer, it was determined that the diode should have been rejected because of an irregularity in processing which, however, did not affect the normal use of such a diode. Each of the other 49 diodes was interchangeable in the tuner.

DESCRIPTION OF THE PREFERRED EMBODIMENT

FIG. 2 is a schematic diagram of the preferred embodiment of the invention. An antenna 10 is coupled to an IF filter 11 which includes well-known trapping circuitry for preventing wave signals of television intermediate carrier frequencies from being coupled to the tuner. The signal from the IF filter is fed to a first tunable circuit which includes an inductor 12, having a tap dividing it into sections 12a and 12b, an inductor 13, an inductor 15, a DC blocking capacitor 17 and a varactor diode 18 of the abrupt junction type. The output of IF filter 11 is connected to the tap on inductor 12. Inductors 12 and 13 are serially connected and the other end of inductor 13 is grounded. A bandswitch 14 is connected across section 12b of inductor 12 and, when closed, shorts out section 12b leaving section 12a of inductor 12 serially connected between inductors 13 and 15. Another bandswitch 16 is connected across inductor 15.

The tuner has five bandswitches which for convenience are indicated as single-pole, single-throw switches operated in unison as indicated by the dashed lines joining the switch elements. In practice the bandswitches comprise well-known diode switch arrangements rather than mechanical devices.

An RF amplifier, in the form of a dual gate FET 20, has a drain electrode D, a grounded source electrode S, a first gate electrode G1 connected via a coupling capacitor 19 to inductor 15 and a second gate electrode G2 coupled to a source of AGC potential (not shown) which is also conventional. The junction of inductor 15 and capacitor 19 is connected to blocking capacitor 17 which, in turn, is coupled to varactor diode 18. The anode terminal of diode 18 is connected to ground. A source of DC tuning potential is developed on a tuning line 61 and the cathode of varactor diode 18 is fed therefrom through a resistor 62. The capacity exhibited by the varactor diode is a function of the applied tuning voltage and changes therein affect tuning of the first tunable stage.

The drain electrode of RF amplifier 20 is connected to a source of B+ potential through the inductive portion of a second tunable circuit comprising an inductor 25, having sections 25a and 25b, a blocking capacitor 28 and an abrupt junction varactor diode 30. The B+ source is bypassed to ground through a capacitor 27 and a bandswitch 26 is connected in shunting relationship with inductor section 25b. The varactor diode is supplied tuning voltage from tuning line 61 through a resistor 63.

A mutual inductance M couples drain terminal D to a third tunable network comprising the series arrangement of a blocking capacitor 31 and an abrupt junction varactor diode 32 parallelled by an inductor 33 having a section 33a and a section 33b. The anode of varactor diode 32 is connected to ground and its cathode is connected to tuning line 61 through a resistor 64. Another bandswitch 34 is connected in shunting relationship with inductor section 33b. The third tunable network is coupled through a capacitor 35 to the base of a mixer transistor 36 which, in turn, is connected to a block 60 labelled TV RECEIVER. This block should be understood to contain all of the well-known circuitry for developing the video and audio representations in the television signals received from mixer 36 as well as the circuitry for generating appropriate power supply voltages.

In this connection, one terminal is indicated as supplying B+ potential to the tuner. Another terminal, connected to a dashed line box 70 labelled REG. +V, supplies a temperature stabilized, regulated source of DC voltage for developing the tuning voltages on the tuning line. Receiver 60 also includes a dashed line box 71, labelled AFC, which will be understood to supply minor corrective tuning voltages to the tuning line as a function of accuracy of tuning, generally measured by the deviation of the actual frequency of the IF signal in the receiver from a standard IF frequency.

An oscillator transistor 50 has its base electrode connected to the junction of a pair of resistors 53 and 54 connected between B+ and ground. The base is bypassed by a capacitor 55 connected in parallel with resistor 54. The emitter electrode of transistor 50 is coupled to its collector electrode through a capacitor 51 and to B+ through a resistor 52. The collector is also coupled to a fourth tunable network comprising an abrupt junction varactor diode 40 serially connected to ground through a capacitor 41 connected in parallel with an inductor 37 having sections 37a and 37b. The cathode of varactor diode 40 is coupled to tuning line 61 through a resistor 65 and its anode is coupled to the junction of blocking capacitor 42 and inductor section 37a. The other end of capacitor 42 is connected to the base of mixer transistor 36. Inductor section 37b is connected to ground and is parallelled by a bandswitch 38 and a capacitor 39.

The tuner functions conventionally with the input to the RF amplifier (first tunable circuit) being tunable by varying the tuning voltage on varactor diode 18, the first and second interstage coupling networks (corresponding to the second and third tunable networks, respectively) being tunable by varying the tuning voltage on varactor diodes 30 and 32 and the oscillator being tunable by varying the DC tuning voltage on varactor diode 40 in the fourth tunable network. In accordance with standard television practice, the RF amplifier and the interstage coupling networks are tuned to the frequency of the picture carrier of the incoming signal whereas the oscillator is tuned to a frequency greater than the frequency of the incoming signal picture carrier by an amount equal to the desired IF signal, namely, 45.0 MHz. Bandswitches 14, 16, 26, 34 and 38 are open as shown for tuning in the Lo VHF band region (corresponding to channels 2–6). When the bandswitches are closed the appropriate inductive sections or elements are shorted out, effectively raising the resonant frequencies of the tuner circuits for tuning in the Hi band regions (channels 7–13). The tuning voltage ranges overlap considerably for these bands because of the abrupt junction varactor diodes. Capacitor 39 is in series with varactor diode 40 to provide the smaller tuning capacitance for the oscillator which is tuned to a higher frequency than the other stages.

A switch assembly 100 preferably includes a ceramic substrate 101 (indicated in dashed lines) with appropriate patterns of deposited conductive connectors and precision voltage dividers 200 and 220 and potentiometer resistance elements 131–134. Details of the switching elements and substrate will be discussed with reference to FIGS. 3–11. The arrangement of the switch assembly and the substrate, as well as its combination with a television tuner having abrupt junction varactor diodes is the subject of the above-mentioned copending application Ser. No. 502,482.

Substrate 101 is preferably made of alumina and the resistors in Lo band voltage divider 200 and Hi band voltage divider 220 are made from printed resistive material, which are screened on, baked and laser trimmed to bear a precise ratio to each other. A rotary channel switch wiper 121 sequentially makes connection with a plurality of channel stationary contacts 124 labelled CH2–CH13 and U1–U6. The designation CH stands for a VHF channel, while the U designation indicates a channel in the UHF spectrum. Thus channel switch wiper 121 is sequentially movable over contacts 124 corresponding to VHF channels 2–13 and any six UHF channels.

The Lo band VHF voltage divider 200 comprises a series connection of a resistor 201, potentiometer resistance element 133 having a shorting wiper 137, and resistors 202, 203, 204, 205 and 206 connected between +V and ground. Resistor 206 is bridged by potentiometer resistance element 132 having a shorting wiper 136. An AFC equalizing resistor is connected between the junctions of each pair of resistors in the divider network and the respective one of contacts CH2–CH6. For example, equalizing resistor 207 connects contact CH6 to the junction of potentiometer resistance element 133 and resistor 202, resistor 208 connects CH5 to the junction of resistors 202 and 203 and, in a similar manner, equalizing resistors 209, 210 and 211 connect the corresponding resistor junctions of voltage divider network 200 to contacts CH4, CH3 and CH2, respectively.

Hi band voltage divider 220 includes a series connection from +V of potentiometer resistance element 134 having a shorting wiper 138, resistors 222–227, a resistor 221 and a resistor 228 to ground. Potentiometer resistance element 131 having a shorting wiper 135 is connected across resistor 228. In similar fashion, AFC equalizing resistors 229–235 interconnect the resistor junctions of the divider network to CH7–CH13 terminals.

A block labelled AFC defeat is indicated as being coupled to channel switch wiper 121 and to AFC circuit 71. The AFC defeat is shown within the confines of substrate 101 and in the preferred embodiment comprises a wiper switch element mounted on the substrate. However, as will be obvious to those skilled in the art, any convenient form of AFC defeat may be utilized with equal facility, its purpose being to disable the AFC circuit 71 between channel switch positions.

A bandswitch control 75 is also indicated as being within the confines of substrate 101 and coupled to channel switch wiper 121. Bandswitch control 75 is shown in operative relationship with the mechanical bandswitches previously described and in the preferred embodiment comprises B+ switching elements mounted on the substrate for supplying a positive potential when the Hi band VHF channels and UHF channels are selected.

A block 80, labelled DETENT, is shown coupled to channel switch wiper 121, though not located within the confines of substrate 101. It will be appreciated by those skilled in the art that detent 80 may comprise any of a well-known number of means for positively positioning channel switch wiper 121 at each of channel stationary contacts 124. The mechanism by which this is performed constitutes no part of this invention and is, therefore, not disclosed in detail.

The remaining channel stationary contacts, labelled U1–U6, are connected to a corresponding plurality of potentiometers or voltage sources of appropriate value (not shown) for receiving selected ones of television signals in the UHF spectrum. Channel switch wiper 121 is connected to tuning line 61 and is shown engaging contact CH2, corresponding to the VHF channel 2 position. In this position, the potential existing at the junction of resistors 205 and 206 in voltage divider 200 is impressed upon tuning line 61 through resistor 211 and applied to the various abrupt junction varactor diodes 18, 30, 32 and 40, through resistors 62–65, respectively.

The AFC equalizing resistors compensate for the non-uniformity of the varactor diode tuning voltage curves throughout the frequency spectrum whereby a given change in AFC voltage at one end of the Hi or Lo bands would have a different frequency correction effect than the same AFC correction voltage at the opposite ends of the bands. The equalizing resistors are selected to provide overall "equal effect" AFC.

Because of the predictability of the C-V characteristic curve for abrupt junction diodes, the resistors in the voltage divider networks may be specified in terms of their ratios to the whole. Thus for network 200, the sum of resistors 202, 203, 204 and 205 is assumed to be 100 percent. Then 202 is approximately 51 percent of the total, 203 about 34 percent, 204 about 9 percent and 205 about 6 percent. Similarly, for network 220, the total of resistors 222–227 is 100%. Then resistor 222 is approximately 26 percent, 223 about 21 percent, 224 about 17 percent, 225 about 14 percent, 226 about 12 percent and 227 about 10 percent.

The actual values are, of course, dependent upon the desired (or acceptable) current flow bearing in mind the effective source impedance presented by the string and the regulating capability of the source REG. +V.

The tuner just described has been constructed and successfully demonstrated. Other component part values and voltages of interest are:

Varactor diodes 18, 30, 32 and 40 — Motorola MV 2105
FET 20 — Zenith Part No. F121-787
REG. +V 70 — 33 volts
Tuning voltages Lo band 1–23 volts
Tuning voltages Hi band 5–23 volts

| Inductor | 12a | 0.04 ($\mu$h) | Capacitor | 17 | 1000 pf ($\mu\mu$f) |
|---|---|---|---|---|---|
| | 12b | 0.05 | | 19 | 28 |
| | 13 | 0.005 | | 27 | 1000 |
| | 15 | 0.20 | | 28 | 1000 |
| | 25a | 0.25 | | 31 | 1000 |
| | 25b | 0.045 | | 35 | 4 |
| | 33a | 0.045 | | 39 | 6 |
| | 33b | 0.25 | | 41 | 60 |
| | 37a | 0.03 | | 42 | 1.0 |
| | 37b | 0.08 | | 55 | 1000 |

Resistors 62, 63, 64 and 65 — 10K ohms

FIG. 3 shows the substrate 101 of switch assembly 100 used in conjunction with the abrupt junction varactor diode tuner of this invention. The substrate is preferably made of a stable ceramic material such as alumina and has a central aperture 102 and a plurality of printed resistive and conductive elements. A plurality of terminals 104 are formed by metallized areas along one edge of the substrate to facilitate connection of the assembly to external apparatus. The substrate may be mounted in any convenient manner with the regularly arranged terminals 104 cooperating with a corresponding socket member (not shown). Since the substrate will have switching apparatus cooperating therewith (possibly including a detent mechanism), prudence dictates it be supported at various points about its periphery. Alternatively, the switching apparatus and detent mechanism may be supported apart from the substrate, in which case the substrate need not be rigidly mounted. It will be seen that the switch assembly arrangement lends considerable flexibility to the design of a television tuner and receiver.

A plurality of circumferentially arranged metallized areas form stationary contacts 124. They bear channel designations as in FIG. 2, with the exception that the VHF channel contacts omit the letters CH due to space limitations. Accordingly, contacts 124 are labelled U1–U6, corresponding to the non-specified UHF channels, and 2–13, corresponding to the similarly numbered VHF channels. The conductive interconnections between various resistance elements and contact areas on the substrate are labelled 103. Hence contacts U1–U6, for example, are connected to appropriate ones of terminals 104 through conductive elements 103.

A circular AFC contact ring 105 is formed outwardly adjacent aperture 102. Next to ring 105 is a plurality of interconnected shorting bars 109. AFC ring 105 and shorting bars 109 are brought out to appropriate ones of terminals 104 indicated as being connected to AFC 71. As will be seen, in conjunction with the switching mechanism, that contact ring 105 and shorting bars 109 comprise AFC defeat 72 of FIG. 2 for shorting AFC circuit 71 between channel positions.

A channel switch contact ring 120 is interposed between shorting bars 109 and stationary contacts 124. This ring is in two segments to facilitate bringing the AFC connections to their appropriate terminals. Both sections are connected together at appropriate ones of terminals 104 and are indicated as being connected to tuning line 61. As with the AFC contact ring and shorting bars, the channel switch contact ring operates in conjunction with a movable wiper element for connecting the appropriate ones of the channel stationary contacts to the tuning line.

Portions of a plurality of trimmer potentiometer assemblies 130 are formed in the corners of substrate 101. These portions include the potentiometer resistance elements 131–134 and connecting leads and solder pads. The one of potentiometers 130 located in the upper left corner of substrate 101 is shown and includes a housing 140 and knob 147. It should be recognized that the substrate only includes the resistance elements, solder pads and connecting leads actually on the alumina. The resistive elements 131–134 are of standard "C" shaped configuration. The three radially disposed solder pads adjacent to and outside of each C shaped element are, as will be described later, used to attach the metallic housings 140 of the potentiometer assemblies 130 directly to substrate 101.

All of the resistors forming voltage divider network 200 of FIG. 2 as well as the AFC equalization resistors (resistors 201–211 and resistance elements 132 and 133) are on the substrate. Similarly, all of the resistors forming voltage divider network 220 and its AFC equalizing resistors (221–235 and resistance elements 131 and 134) are disposed on the substrate. The resistors and the potentiometer resistance elements are preferably formed of deposited resistive material overlying (or underlying as the case may be) appropriately patterned conductive elements 103. The techniques for making substrate 101 with its deposited conductive and resistive elements are well known and will not be detailed in this disclosure.

An AFC wiper contact 106 is indicated by the double-headed arrow overlying contact ring 105 and shorting bars 109. Similarly, channel switch wiper contact 121 is indicated by a double-headed arrow overlying channel switch contact ring 120 and the one of stationary contacts 124 labelled 2. The double-headed arrows are schematic representations of the connections made by the appropriate wipers when the channel 2 position is selected.

FIG. 4 shows the reverse side of substrate 101. The plurality of terminals 104 are located along the edge of the substrate in registration with their counterpart terminals of FIG. 3. A B+ contact ring 160 is outwardly disposed radially of circular aperture 102 and is connected via a conductive connector 103 to a terminal at the edge of substrate 101, labelled B+. A C shaped Hi band and UHF bandswitch contact ring segment 165 is radially outwardly disposed of contact ring 160. Ring segment 165 is connected to the one of terminals 104 designated bandswitch. A Lo band contact ring segment 164 is isolated from ring 165. Ring segment 164 is not connected externally (and indeed has no electrical function), but provides a track for the wiper contact (not shown in this figure). The outer conductive ring consists of a UHF B+ segment 162 and a VHF B+ segment 163 both appropriately connected by conductive elements 103 to respective ones of terminals 104, labelled $V_{B+}$ and $U_{B+}$, respectively. Again, the double-headed arrows 161 joining various segments of the ring contacts are incorporated to schematically indicate the wiper connections made when in the channel 2 position.

In FIG. 5 there is shown a view of the substrate of FIG. 3 with channel switch wiper 121 and AFC wiper 106 in position for tuning VHF television channel 2. A rotatably movable end plate 171 for supporting the wipers in fixed relationship to each other and an operating shaft 175 for moving the end plate are shown in FIG. 6, with the wiper outlines indicated in dashed lines and the contacts indicated by dashed-line circles. The arrangement of operating shaft 168 and a bearing shaft 173 (part of end plate 171) will be described in detail with reference to FIGS. 9, 10 and 11.

Wipers 106 and 121 are annularly shaped members formed of resilient metal and each have three contacts, either formed by deformation of the annular members or by attachment of contact material thereto. As will be seen, because of the wiper's resiliency, the contacts are urged into good mechanical and electrical connection with their respective contact rings. Also, the wipers are not rigidly attached to the end plates and the three point contact arrangements allow them to adjust and provide uniform contact pressure and minimum wear. Channel switch wiper 121 has a pair of mounting tabs 122 (shown in cross section in FIG. 5) for attaching the wiper to end plate 171 in a pair of mounting apertures 179. Similarly, AFC wiper 106 has a pair of mounting tabs 107 cooperating with correspondingly located mounting apertures 180 in end plate 171. Preferably, the mounting apertures are slightly larger than the cross sectional areas of the mounting tabs to provide a degree of lateral freedom of movement for the wiper elements. Obviously, the wipers may not have any significant freedom of movement in the rotational directions.

It will be noted that shaft 168 has two flat sides for alignment of the end plate 171 and correspondinng wiper elements 106 and 121. Shaft 168 is detented by any convenient means (not shown) to insure a positive locking action in each channel selection position. With the 12 VHF and 6 UHF channel arrangement shown, an 18 position detent mechanism would be provided for shaft 168.

The three contacts of circular wiper 121 are labelled 123a, 123b and 123c with contacts 123b and 123c located inwardly of contact 123a. Wiper 121 is shown broken away in the areas of the contacts to illustrate the relationship between the contacts and contact ring 120 and stationary contacts 124. The AFC wiper also has three contacts 108a, 108b and 108c with contact 108a extending outwardly of contacts 108b and 108c. Wiper 106 is shown broken away in the areas of contacts 108a and 108c to clearly indicate that when a channel selection position, contact 108a is not in contact with any of shorting bars 109.

FIG. 7 is a partial view of the rear of substrate 101 with the B+ and bandswitch wiper 161 shown in the channel 2 tuning position. FIG. 8 shows end plate 172 with wiper 161 (in dashed lines) mounted thereon. Wiper 161 has three contacts 167a, 167b and 167c and is appropriately broken away to show contact 167a on VHF B+ segment 163, contact 167b on Lo band ring 164 and contact 167c on the common B+ ring 160. Wiper 161 includes a pair of mounting tabs 166 engaging appropriately located mounting slots 184 in end plate 172. End plate 172 includes an aperture 181 cooperating with a similarly shaped portion of bearing shaft 173 for fixing the relationship between the wiper and operating shaft 168. The curved portions 182 and 183 of aperture 181 cooperate with a pair of lock tabs 176 on the bearing shaft. Details of this structure will be described in connection with FIGS. 9–11.

Both end plates 171 and 172 are preferably fabricated of a non-conductive material such as plastic. It will be appreciated that the particular size and shape of the end plates as well as the constructional details of the bearing shaft to be described is a matter of choice and may take any of a number of well-known forms and that the illustrated configuration is merely one of many suitable for the purpose.

It will also be appreciated that the instant invention is directed to a tuner with abrupt junction varactor diodes. The disclosed switch assembly with a ceramic substrate having deposited resistive and conductive elements (as well as its combination with the abrupt junction varactor diode tuner of this invention) for providing precision voltage dividers and as well as integrally mounted adjustable elements is the subject of the above-mentioned copending application Ser. No. 502,482. Additionally, the particular potentiometer construction to be described forms no part of the instant invention, but comprises an invention described and claimed in the above-mentioned copending application Ser. No. 494,113.

FIGS. 9 and 10 are perspective views of end plates 171 and 172, without the switch wipers. Bearing shaft 173, which is preferably formed as part of end plate 171, includes an appropriately shaped longitudinal opening for reception of operating shaft 168 (not shown). Bearing shaft 173 is slotted with a slot 174 throughout its length. The slot extends into end plate 171 and enables the separated halves of bearing shaft 173 to be brought together to permit fitting into aperture 181 in end plate 172. The shape of the lock tabs create a camming force tending to squeeze the bearing shaft parts together when being inserted into aperture 181. When the lock tabs clear the surfaces 182 and 183, the separate halves of the bearing shaft snap back to their original position and lock tabs 176 bear against end plate 172 preventing end plate 172 from being removed. It will also be recognized that a close fit is maintained between bearing shaft 173 and end plate 172 by virtue of operating shaft 168 being inserted in the aperture of bearing shaft 173. End plates 171 and 172 have collars 178 and 177, respectively, for cooperation with the substrate surface.

FIG. 11 shows a cross sectional view of a completed switch assembly. Both end plates 171 and 172 are shown with collars 178 and 177 abutting against and in bearing relationship with substrate 101. It should be recognized that a slight amount of end play is left between the substrate and collars to enable end plate 172 to be positioned past lock tabs 176 (not shown in this figure). Bearing shaft 173 is slightly smaller in diameter than circular aperture 102 in the substrate which provides for free rotational movement therein mentioned previously. AFC wiper 106 and channel switch wiper 121 and their corresponding contacts 108b and 123b are shown in engagement with appropriate ones of the ring contacts on the substrate. As mentioned, the wipers are not securely mounted to the end plates and are, therefore, free to move slightly in the lateral direction. The three contacts on each wiper coact with the mounting to provide uniform contact pressure and help insure long trouble-free service.

FIG. 12 is an underside view of the upper portion of one of the potentiometers 130. It includes a conductive housing 140 and a resilient metallic wiper 135 staked to a control shaft 148 mounted for rotatable movement with respect to the housing. As best shown in FIGS. 13 and 14, housing 140 includes three mounting feet 150 for cooperation with soldering pads 115 on substrate 101. While not specifically shown, the feet (and corresponding soldering pads) may be non-uniformly spaced to provide a simple arrangement for assuring proper orientation of the housing on the substrate. Housing 140 includes a flat portion 151 which also assists in orientation. Wiper 135 has a flange or projection 145 and a pair of circular arm members 141 and 142 extending in generally helical paths about control shaft 148. Arm member 141 terminates in a contact 143 and arm member 142 terminates in a contact 144. The provision of split contacts for moving over a resistance element is a standard practice. A stop 146 in the form of an abutment is provided in the housing for limiting the rotary travel of wiper 135. Arms 141 and 142 are deflected from the plane of the main body of wiper 135 at bend lines 149.

FIGS. 13 and 14 represent views of the upper portion of potentiometer 130 of FIG. 12 taken along the combined straight and arcuate section line 13—13. A knob 147 is disposed on control shaft 148 (not shown in these figures) and wiper 145 is attached thereto by staking, for example. A line R, representing the substrate surface, is shown in contact with feet 150. Contacts 143 and 144 are seen to occupy a first position, outside the housing and below line R. Of course, during operation with housing 140 firmly mounted on substrate 101, contacts 143 and 144 will occupy an intermediate position in pressure engagement with resistance element 131 because of the resiliency of arms 141 and 142.

In FIG. 14 flange 145 is shown overlying stop 146, and contacts 143 and 144 are in a second position within housing 140 and above line R. In this position, which is attainable by deflecting arms 141 and 142 into housing 140 and rotating wiper 135 to place flange 145 in overlying relationship with stop 146, the potentiometer housing is placed on the substrate with feet 150 in overlying relationship with solder pads 115 and soldered. After soldering, the potentiometer is activated by turning knob 147 to rotate flange 145 off of stop 146 and place the contacts in their normal operating position intermediate the first and second positions. In so doing, contacts 143 and 144 are forced into pressure engagement with the resistance element to make good electrical and mechanical contact, and flange 145 cooperates with stop 146 to limit travel of the wiper.

What has been described is a novel tuner incorporating abrupt junction varactor diodes having predictable capacitance tuning voltage characteristics, making them interchangeable in the tuned stages of the tuner without elaborate sorting and grouping.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A tuner for tuning television signals in a predetermined frequency range having a maximum and minimum frequency comprising: translation and conversion means for receiving television signals and heterodyning the received signals with locally produced oscillatory signals to produce substantially fixed frequency intermediate frequency signals, said translation and conversion means having an input capacitance which limits high frequency signal gain and including a plurality of stages having tunable circuits each with an abrupt junction type variable capacitance diode for tuning thereof; means for imposing tuning voltages on said variable capacitance diodes for simultaneously varying their capacitances to change the tuning of said tunable circuits, said variable capacitance diodes having a capacitance-to-voltage characteristic which is predictable from diode-to-diode and which precludes the need for matching diodes to assure frequency tracking of said tunable circuits with tuning voltage changes on said diodes and being selected to have a capacitance at said maximum frequency that is greater than said input capacitance and a capacitance at said minimum frequency which satisfies the criterion that the gain-bandwidth product of said tuner is substantially constant over said predeterminned frequency band.

2. A tuner as set forth in claim 1, wherein said translation and conversion means comprise an RF amplifier, an oscillator and an interstage coupling, each including one of said plurality of tunable circuits, said variable capacitance diodes having substantially similar characteristics for providing frequency matching between said RF amplifier, oscillator and interstage coupling to maintain the frequency of said IF signal and said gain-bandwidth product substantially constant over the range of tuning voltages employed.

3. A tuner as set forth in claim 2, wherein the ratio between said capacitance at said maximum frequency and said capacitance at said minimum frequency is about 2.5 and the minimum value of capacitance for said variable capacitance diodes is about 7 pf.

4. A tuner as set forth in claim 3, wherein each said tunable circuit has an inductive reactance; and bandswitching means operating when changing tuning from signals in a low frequency portion of said range to signals in a high frequency portion of said range by changing said inductive reactance.

5. A tuner as set forth in claim 4, wherein said tuning voltages for said variable capacitance diodes substantially overlap for each of said frequency portions.

6. A tuner as set forth in claim 5, wherein said low frequency portion embraces channels 2–6 and said high frequency portion embraces channels 7–13.

7. A tuner as set forth in claim 6, wherein said interstage coupling includes an additional tunable circuit including an abrupt junction type variable capacitance diode.

8. A tuner for tuning to transmitted television signals in a frequency range having a given maximum to minimum frequency ratio (F) comprising: signal translation means, including an oscillator and mixer for generating a fixed IF signal, having an input capacitance which limits high frequency signal gain; a plurality of tunable circuits in said signal translation means each including a variable capacitance diode, said variable capacitance diodes having a capacitance-to-voltage characteristic which is predictable from diode-to-diode and which precludes the need for matching diodes to assure frequency tracking of said tunable circuits with tuning voltage changes on said diodes; means for supplying tuning voltages to said variable capacitance diodes for simultaneously adjusting the capacitance thereof, the capacitance voltage characteristic of said variable capacitance diodes determined by $$\frac{C_2}{C_1} = \left(\frac{V_1+\phi}{V_2+\phi}\right)^\gamma$$

and providing a range of capacitance change Cmax/Cmin determined by $$\frac{C_{max} + C_s}{C_{min} + C_s} > (F)^2$$

where $C_1$ and $C_2$ are the capacitances of the varactor diode at any tuning voltages $V_1$ and $V_2$, $\phi$ is a constant related to the contact potential of the diode, $\gamma$ is a constant having a maximum value of 0.5, Cmax and Cmin are the maximum and minimum values of tuning capacitance, respectively, and Cs is the stray capacitance of the signal translation means and includes said input capacitance.

9. A tuner as set forth in claim 8, wherein Cs has a value on the order of 5 pf.

10. A tuner as set forth in claim 9, wherein $\gamma$ has a value on the order of 0.46.

11. A tuner as set forth in claim 10, wherein said frequency range is divided into two bands; and including means for switching reactive elements in said tunable circuits; the tuning voltage ranges over both said bands being substantially the same.

12. An electronic television tuner without a fine tuning control for receiving and translating television signals in a fixed frequency range comprising: a plurality of varactor tuned stages, including abrupt junction varactor diodes having capacitance-to-tuning voltage characteristics which are predictable from diode-to-diode and which precludes the need for matching diodes to assure frequency tracking of said tunable circuits with tuning voltage changes on said diodes; means supplying tuning voltages to said varactor tuned stages for tuning said tuner to individual television signals in said frequency range; a stable voltage divider network comprising a plurality of resistors and voltage terminals at which said tuning voltages are developed; and setting means coupled to said voltage divider network for setting the tuning voltage of at least one of said voltage terminals to enable reception and translation of a corresponding one of said television signals.

13. The tuner of claim 12, wherein the resistors in said divider network bear a precise relationship determined by said capacitance-to-tuning characteristic for adjusting the capacitances of said varactor diodes to tune each successive television signal.

14. The tuner of claim 13, wherein one of said networks includes four resistors bearing individual ratios to the total network resistance of about 51 percent, 34 percent, 9 percent and 6 percent and the other network includes six resistors bearing individual ratios to the total network resistance of about 26 percent, 21 percent, 17 percent, 14 percent, 12 percent and 10 percent.

15. The tuner of claim 13, further including voltage regulating means for producing a highly regulated DC voltage within a given range of DC voltages; said setting means coupling said voltage divider network to said regulating means and setting tuning of said tuner by compensating for the variation of said DC voltage from a nominal value within said given range of DC voltages.

16. The tuner of claim 15, wherein said setting means includes a potentiometer connected to each end terminal of said voltage divider network, the configuration of potentiometers and divider network being connected across said regulating means; one of said potentiometers being adjustable to provide a voltage at one of said end terminals for tuning to a television signal frequency near one end of said frequency range and the other of said potentiometers being adjustable to provide a voltage at the other of said end terminals for tuning to a displaced television signal.

17. The tuner of claim 16, wherein said frequency range is divided into two bands; and including a bandswitch for selectively changing the inductive reactance of said varactor tuned stages for tuning in each band, one of said voltage divider networks being provided for each band, with each network having an adjustable potentiometer at each end terminal.

18. The tuner of claim 17, wherein each potentiometer is set to produce a tuning voltage at its end terminals corresponding to the lowest and highest television signals in its band, the precise relationship between the resistors of each network automatically determining correct tuning voltages for intermediate television signals in each said band.

19. The tuner of claim 18, wherein said means for supplying tuning voltages comprise a switch making selective contact with said terminals.

20. The tuner of claim 19, further including AFC means including equalizing resistors interposed between junctions of said resistors in said voltage dividers and the corresponding terminals for equalizing the effect of AFC over said tuning range.

21. The tuner of claim 20, wherein the voltage divider network in one of said bands provides voltages at said voltage terminals for tuning VHF channels 2–6 and the other divider network provides tuning voltages at its voltage terminals for tuning VHF channels 7–13.

* * * * *